United States Patent
Cheng et al.

(10) Patent No.: US 9,525,001 B2
(45) Date of Patent: Dec. 20, 2016

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Feng-Chi Hung, Chu-Bei (TW); Kuo-Cheng Lee, Tainan (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/675,382

(22) Filed: Mar. 31, 2015

(65) Prior Publication Data

US 2016/0190196 A1 Jun. 30, 2016

Related U.S. Application Data

(60) Provisional application No. 62/098,178, filed on Dec. 30, 2014.

(51) Int. Cl.
*H01L 31/0232* (2014.01)
*H01L 27/146* (2006.01)
*H01L 27/148* (2006.01)
*H01L 21/768* (2006.01)

(52) U.S. Cl.
CPC ... *H01L 27/14634* (2013.01); *H01L 21/76807* (2013.01); *H01L 27/1469* (2013.01); *H01L 27/14632* (2013.01); *H01L 27/14636* (2013.01); *H01L 27/14687* (2013.01); *H01L 27/14812* (2013.01)

(58) Field of Classification Search
CPC ............... H01L 27/14634; H01L 27/14636; H01L 27/14632; H01L 27/14687; H01L 27/1469; H01L 27/14812; H01L 21/76807
USPC ........ 257/226, 228, 432, 443, 459, E27.122, 257/E27.132, E27.133, E31.122, E31.127, 257/E21.585; 438/70, 72, 98; 348/294, 438/308; 250/208.1
See application file for complete search history.

(56) References Cited

U.S. PATENT DOCUMENTS

| | | | | |
|---|---|---|---|---|
| 8,422,837 B2 * | 4/2013 | Nishi | ................. | G02B 6/12002 257/432 |
| 8,466,060 B2 * | 6/2013 | Feng | ................... | H01L 23/3107 257/698 |
| 8,921,901 B1 * | 12/2014 | Kao | ................. | H01L 27/14687 257/226 |
| 2007/0045665 A1 | 3/2007 | Park | | |

(Continued)

FOREIGN PATENT DOCUMENTS

KR  10-07929735 B1  6/2007
KR  2013-0129055 A  11/2013
(Continued)

*Primary Examiner* — Dao H Nguyen
(74) *Attorney, Agent, or Firm* — Maschoff Brennan

(57) ABSTRACT

A semiconductor device includes a first substrate, a second substrate, a plurality of through vias (TVs), and a plurality of conductive caps. The first substrate has at least one electrical component disposed thereon. The second substrate is stacked on the first substrate. The TVs extend through the second substrate to be electrically connected to the at least one electrical component of the first substrate. The conductive caps respectively cover the TVs, and the conductive caps are electrically isolated from each other.

20 Claims, 9 Drawing Sheets

(56) References Cited

U.S. PATENT DOCUMENTS

| | | | | |
|---|---|---|---|---|
| 2008/0224181 A1* | 9/2008 | Uya | ............... | H01L 27/14609 |
| | | | | 257/228 |
| 2011/0155893 A1* | 6/2011 | Endo | ............... | H01L 27/14632 |
| | | | | 250/208.1 |
| 2011/0233785 A1* | 9/2011 | Koester | ............... | H01L 21/768 |
| | | | | 257/773 |
| 2013/0020468 A1* | 1/2013 | Mitsuhashi | ....... | H01L 27/14623 |
| | | | | 250/208.1 |
| 2013/0168791 A1* | 7/2013 | Oganesian | ....... | H01L 27/14618 |
| | | | | 257/432 |
| 2013/0285180 A1* | 10/2013 | Wang | ............... | H01L 27/14618 |
| | | | | 257/432 |
| 2013/0307103 A1* | 11/2013 | Lin | ............... | H01L 27/14687 |
| | | | | 257/432 |
| 2013/0321680 A1* | 12/2013 | Kumano | ......... | H01L 21/76807 |
| | | | | 348/273 |

FOREIGN PATENT DOCUMENTS

| | | |
|---|---|---|
| TW | 201104853 A | 2/2011 |
| TW | 201106478 A | 2/2011 |
| TW | 201125111 A | 7/2011 |
| TW | 201320317 A | 5/2013 |

\* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/098,178, filed Dec. 30, 2014, which is herein incorporated by reference.

BACKGROUND

A three dimensional integrated circuit (3D IC) is an integrated circuit (IC) built by stacking wafers and/or dies and interconnecting them vertically so that they behave as one IC. 3D ICs can pack a deal of functionality into a small "footprint." The different devices in the stack may be heterogeneous, e.g. combining complementary metal-oxide-semiconductor (CMOS) logic and dynamic random access memory (DRAM) into one IC. In addition, critical electrical paths through the IC can be shortened, leading to faster operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
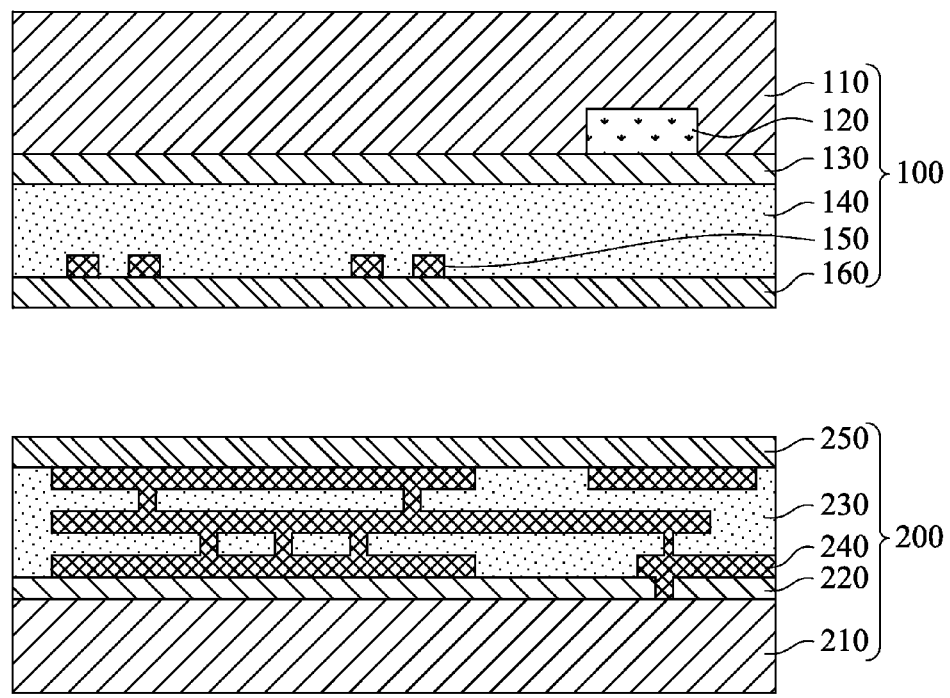
FIGS. 1-13 are cross-sectional views of a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross sectional view of a semiconductor device prior to a bonding process in accordance with some embodiments of the present disclosure. A first semiconductor wafer 100 includes a first substrate 110 and a plurality of electrical components formed thereon. A second semiconductor wafer 200 includes a second substrate 210 and a plurality of electrical components formed thereon.

The first substrate 110 is made of a semiconductor material, such as silicon, germanium, silicon-germanium, or combinations thereof. The first substrate 110 is, for example, bulk silicon or an active layer of a silicon on insulator (SOI) substrate. Other substrates that may be used include multi-layered substrates, gradient substrates, or hybrid orientation substrates.

In some embodiments, the semiconductor device is a stacked backside illumination (BSI) complementary metal-oxide-semiconductor (CMOS) image sensor (CIS). When the semiconductor device is a stacked BSI CIS, the first semiconductor wafer 100 is a sensor wafer, and the second semiconductor wafer 200 is an application-specific integrated circuit (ASIC) wafer. At least one photodetector 120 is formed in the first substrate 110 when the first semiconductor wafer 100 is a sensor wafer. The photodetector 120 is, for example, a photodiode.

As shown in FIG. 1, at least one interlayer dielectric layer 130 and at least one inter-metal dielectric layer 140 are formed on the first substrate 110. In addition, a plurality of connecting lines 150 are formed in the inter-metal dielectric layer 140. The connecting lines 150 are made of a conductive material, such as copper, aluminum, tungsten, titanium, or alloys or combinations thereof. The connecting lines 150 are formed by, for example, deposition, photolithography, and etching, damascene, or dual damascene.

A plurality of electrical circuits 160 may be formed on the inter-metal dielectric layer 140. The electrical circuits 160 formed on the inter-metal dielectric layer 140 may be any type of circuitry suitable for a particular application. The electrical circuits 160 include, for example, transistors, capacitors, resistors, diodes, or combinations thereof.

The electrical circuits 160 are interconnected to perform one or more functions. The functions include, for example, memory, processing, amplifying, power distribution, inputting, outputting, or combinations thereof. In some embodiments, the electrical circuits 160 are interconnected to form a system on a chip (SoC). The person having ordinary skill in the art will appreciate that the aforementioned electrical circuits 160 are provided for illustrative purposes and are not intended to limit the various embodiments to any particular applications.

The second substrate 210 is made of a semiconductor material, such as silicon, germanium, silicon-germanium, or combinations thereof. The second substrate 210 is, for example, bulk silicon or an active layer of a silicon on insulator (SOI) substrate. Other substrates that may be used include multi-layered substrates, gradient substrates, or hybrid orientation substrates.

As shown in FIG. 1, at least one interlayer dielectric layer 220 and at least one inter-metal dielectric layer 230 are formed on the second substrate 210. In addition, a plurality of connecting lines 240 are formed in the inter-metal dielectric layer 230. The connecting lines 240 are made of a conductive material, such as copper, aluminum, tungsten, titanium, or alloys or combinations thereof. The connecting lines 240 are formed by, for example, deposition, photolithography, and etching, damascene, or dual damascene.

A plurality of electrical circuits 250 may be formed on the inter-metal dielectric layer 230. The electrical circuits 250 formed on the inter-metal dielectric layer 230 may be any type of circuitry suitable for a particular application. The electrical circuits 250 include, for example, transistors, capacitors, resistors, diodes, or combinations thereof.

The electrical circuits 250 are interconnected to perform one or more functions. The functions include, for example, memory, processing, amplifying, power distribution, inputting, outputting, or combinations thereof. In some embodiments, the electrical circuits 250 are interconnected to form an analog-to-digital converter. The electrical circuits 250 may also be other functional circuits that may be utilized within a stacked backside illumination (BSI) complementary metal-oxide-semiconductor (CMOS) image sensor (CIS). For example, the electrical circuits 250 may be interconnected to form, for example, a data processing circuit, a memory circuit, a bias circuit, a reference circuit, or combinations thereof. The person having ordinary skill in the art will appreciate that the aforementioned electrical circuits 250 are provided for illustrative purposes and are not intended to limit the various embodiments to any particular applications.

Figure 2:
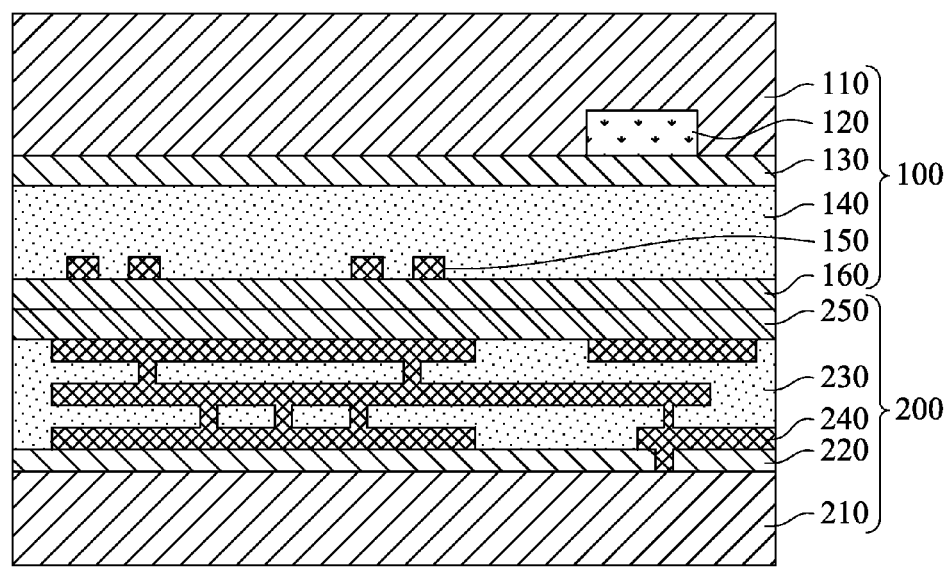

Reference is made to FIG. 2. The first semiconductor wafer 100 is stacked on the second semiconductor wafer 200. In some embodiments, a plurality of bonding pads (not shown) are formed in the first semiconductor wafer 100 and the second semiconductor wafer 200 respectively. Furthermore, the bonding pads located at the second semiconductor wafer 200 are aligned face-to-face with their corresponding bonding pads located at the first semiconductor wafer 100. The first semiconductor wafer 100 and the second semiconductor wafer 200 are bonded together through a bonding process, such as a direct bonding process.

In the direct bonding process, the connection between the first semiconductor wafer 100 and the second semiconductor wafer 200 can be implemented through, for example, metal-to-metal bonding (e.g. copper-to-copper bonding), dielectric-to-dielectric bonding (e.g. oxide-to-oxide bonding), metal-to-dielectric bonding (e.g. copper-to-oxide bonding), or combinations thereof.

Figure 3:
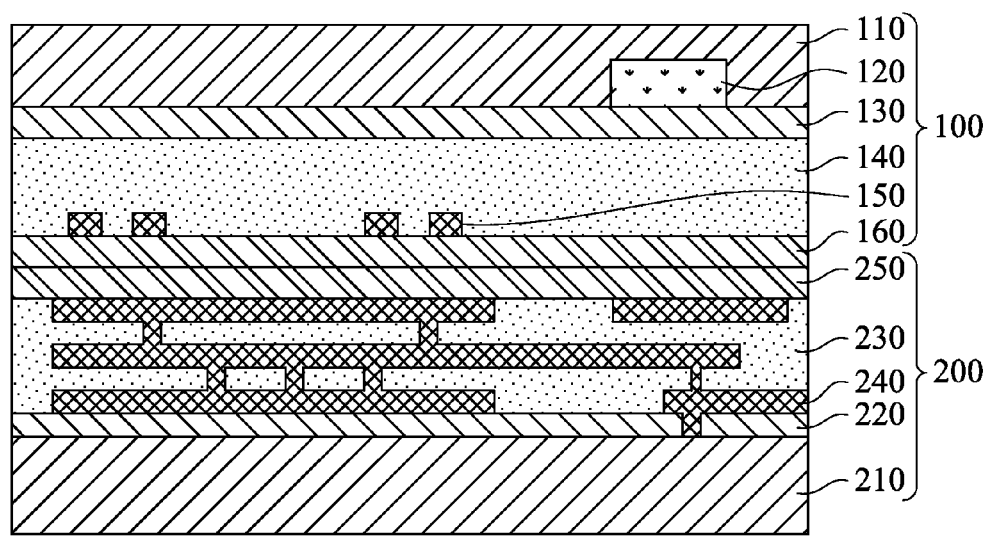

Reference is made to FIG. 3. The first substrate 110 is thinned so that light can strike the photodetector 120 through the first substrate 110. The thinning process is, for example, mechanical grinding, chemical mechanical polishing (CMP), wet etching, atmospheric downstream plasma (ADP) dry chemical etching (DCE), or combinations thereof. In some embodiments, a substantial amount of substrate material is first removed from the first substrate 110 by mechanical grinding. Afterwards, an etching chemical is applied onto the back side of the first substrate 110 to further thin the first substrate 110 to a thickness that is transparent to visible light. When the first substrate 110 is a silicon on insulator (SOI) substrate, the imbedded buried oxide layer (BOX) can act as an etching stop layer. The first substrate 110 has a thickness in a range from about 2 µm to about 10 µm after the thinning process.

The terms "about" may be applied to modify any quantitative representation which could permissibly vary without resulting in a change in the basic function to which it is related. For example, the first substrate 110 as disclosed herein having a thickness in a range from about 2 µm to about 10 µm may permissibly have a thickness somewhat greater than 10 µm if its transparent capability is not materially altered.

Figure 4:
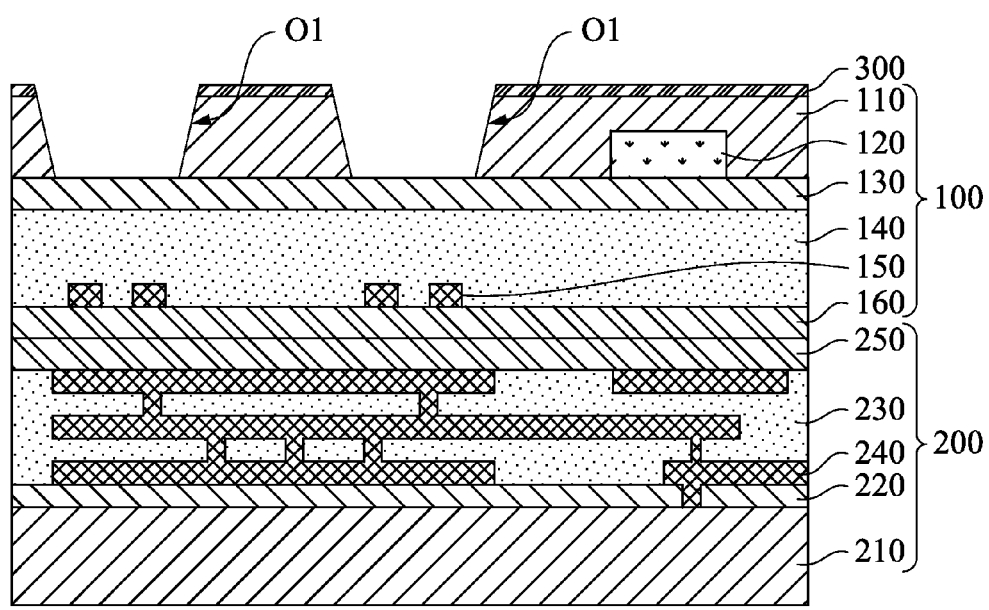

Reference is made to FIG. 4. A bottom anti-reflective coating (BARC) layer 300 is formed on the backside of the first substrate 110. Throughout the description, the side of the first substrate 110 adjacent to the BARC layer 300 is referred to the backside of the first substrate 110.

The bottom anti-reflective coating (BARC) layer 300 is made of, for example, a nitride material, an organic material, an oxide material, or combinations thereof. The BARC layer 300 is formed by, for example, chemical vapor deposition (CVD).

Then, the first substrate 110 and the bottom anti-reflective coating (BARC) layer 300 are patterned to form a plurality of first openings O1 therein. The first substrate 110 and the BARC layer 300 are patterned by a photolithography and etching process. The photolithography and etching process includes photoresist application, exposure, developing, etching, and photoresist removal. The photoresist is applied onto the BARC layer 300 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. Portions of the first substrate 110 and the BARC layer 300 which are not protected by the remaining photoresist are etched to form the first openings O1. The etching of the first substrate 110 and the BARC layer 300 may be, for example, reactive-ion etching (RIE). After etching the first substrate 110 and the BARC layer 300, the photoresist is removed from the BARC layer 300 by, for example, ashing or stripping.

Figure 5:
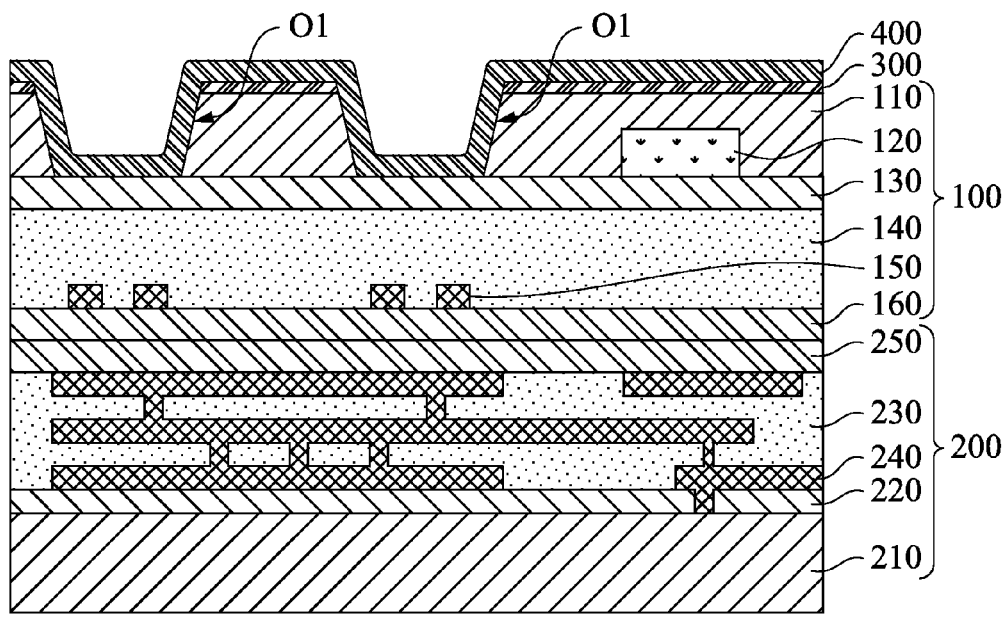

Reference is made to FIG. 5. A first dielectric layer 400 is formed over the bottoms and sidewalls of the first openings O1. In addition, the first dielectric layer 400 is further formed over the BARC layer 300. The first dielectric layer 400 is made of a dielectric material, such as silicon oxide, silicon nitride, silicon oxynitride, a low-K dielectric, doped glass (e.g. boron silicate glass), or combinations thereof. In some embodiments, the first dielectric layer 400 is formed by, for example, chemical vapor deposition (CVD).

Figure 6:
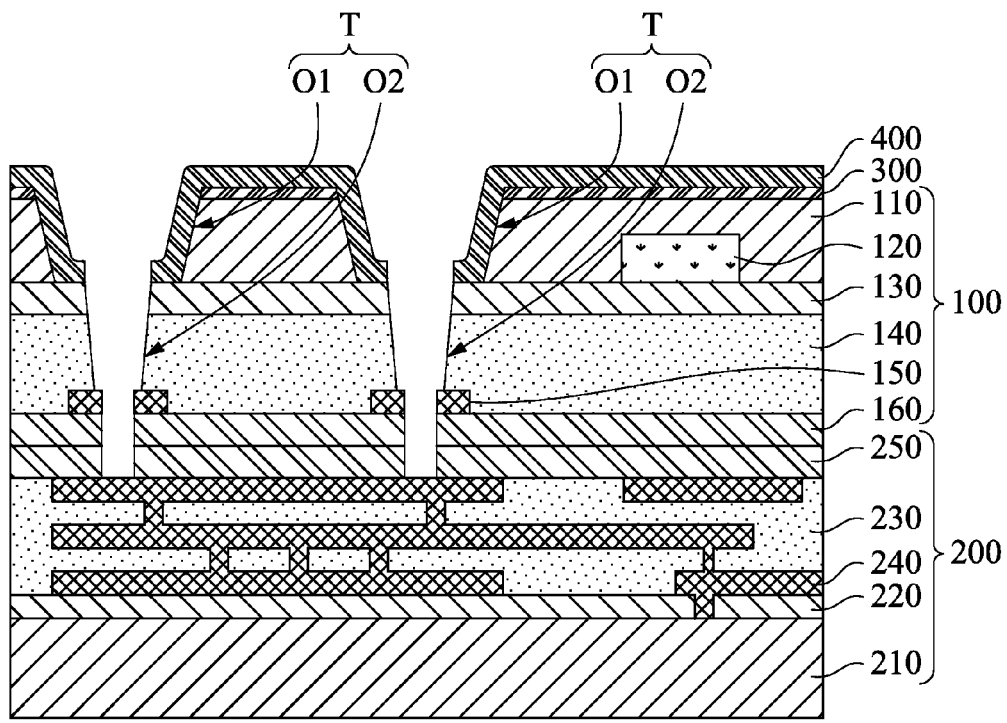

Reference is made to FIG. 6. A plurality of second openings O2 are respectively formed in the bottoms of the first openings O1. The second openings O2 extend through the first dielectric layer 400, the interlayer dielectric layer 130, the inter-metal dielectric layer 140, and dielectric layers where the electrical circuits 160 and the electrical circuits 250 are. The second openings O2 respectively communicate with the first openings O1 to form through holes T. At least parts of the connecting lines 240 are exposed through the through holes T.

The second openings O2 are patterned by, for example, a photolithography and etching process. The photolithography and etching process includes photoresist application, exposure, developing, etching, and photoresist removal. The photoresist is applied onto the first dielectric layer 400 by, for example, spin coating. The photoresist is then prebaked to drive off excess photoresist solvent. After prebaking, the photoresist is exposed to a pattern of intense light. The exposure to light causes a chemical change that allows some of the photoresist soluble in a photographic developer. A post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist. The layers which are not protected by the remaining photoresist are etched to form the second openings O2. The etching may be, for example, reactive-ion etching (RIE). After the etching, the photoresist is removed from the BARC layer 300 by, for example, ashing or stripping.

In some embodiments, the connecting lines 150 are made of a material, such as copper, aluminum, tungsten, titanium, or alloys or combinations thereof, which has a different etching rate from that of the dielectric layers where the electrical circuits 160 and the electrical circuits 250 are. As such, the connecting lines 150 may function as a hard mask layer for the etching of the dielectric layers where the electrical circuits 160 and the electrical circuits 250 are.

Figure 7:
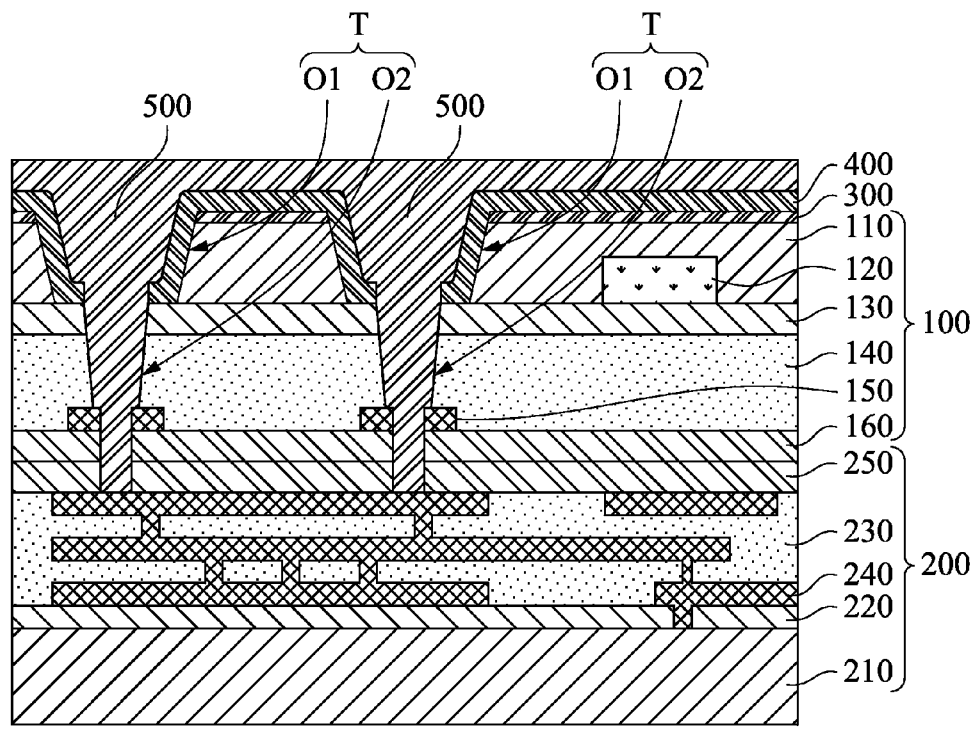

Reference is made to FIG. 7. A conductive material overfills the through holes T to form conductive plugs 500 respectively in the through holes T. The conductive material is, for example, copper, aluminum, tungsten, titanium, or alloys or combinations thereof. In some embodiments, the conductive material is formed by, for example, an electroplating process.

In some embodiments, a barrier layer (not shown) may be formed prior to the electroplating process. The barrier layer may be formed on the bottoms and the sidewalls of the through holes T. The barrier layer is made of, for example, titanium, titanium nitride, tantalum, tantalum nitride, or combinations thereof. The barrier layer is formed by, for example, atomic layer deposition (ALD), chemical vapor deposition (CVD), plasma-enhanced CVD (PECVD), physical vapor deposition (PVD), or plasma-enhanced PVD (PEPVD).

In addition, a seed layer (not shown) may be formed over the barrier layer. The seed layer is made of, for example, copper, nickel, gold, or combinations thereof. The seed layer is formed by, for example, physical vapor deposition (PVD).

Moreover, the seed layer may be alloyed with a material that improves the adhesive properties of the seed layer so that the seed layer can act as an adhesion layer. For example, the seed layer may be alloyed with a material, such as manganese or aluminum, which will migrate to the interface between the seed layer and the barrier layer and will enhance the adhesion between these two layers. The alloying material may be introduced during formation of the seed layer.

Figure 8:
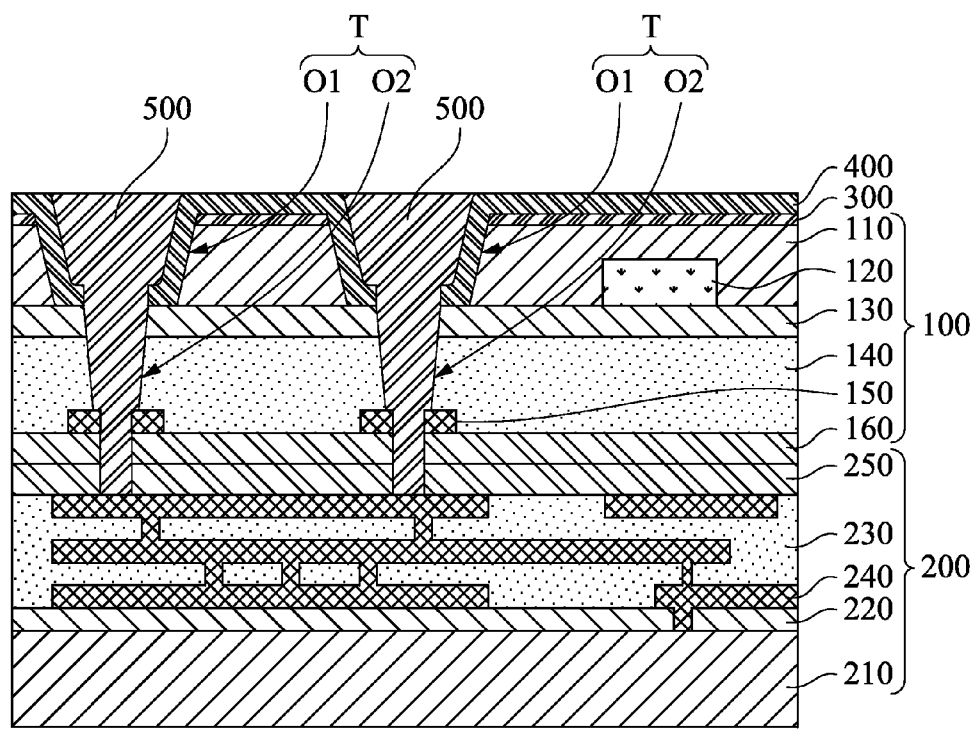

Reference is made to FIG. 8. The excess conductive material outside of the through holes T is removed through a removal process. In some embodiments, the conductive material over burden is removed by a chemical mechanical polishing (CMP) process. In some embodiments, a combination of a plasma etch-back followed by the CMP process is used. The first dielectric layer 400 can act as a polish stop layer to protect the underlying first substrate 110 from CMP damage. After the removal process, the through holes T, the conductive plugs 500 and the first dielectric layer 400 form through vias (TVs). When the first dielectric layer 400 is made of silicon oxide, the TVs are through-oxide vias (TOVs). The TVs electrically connect the electrical components (e.g. the connecting lines 150) of the first semiconductor wafer 100 to the electrical components (e.g. the connecting lines 240) of the second semiconductor wafer 200.

Figure 9:
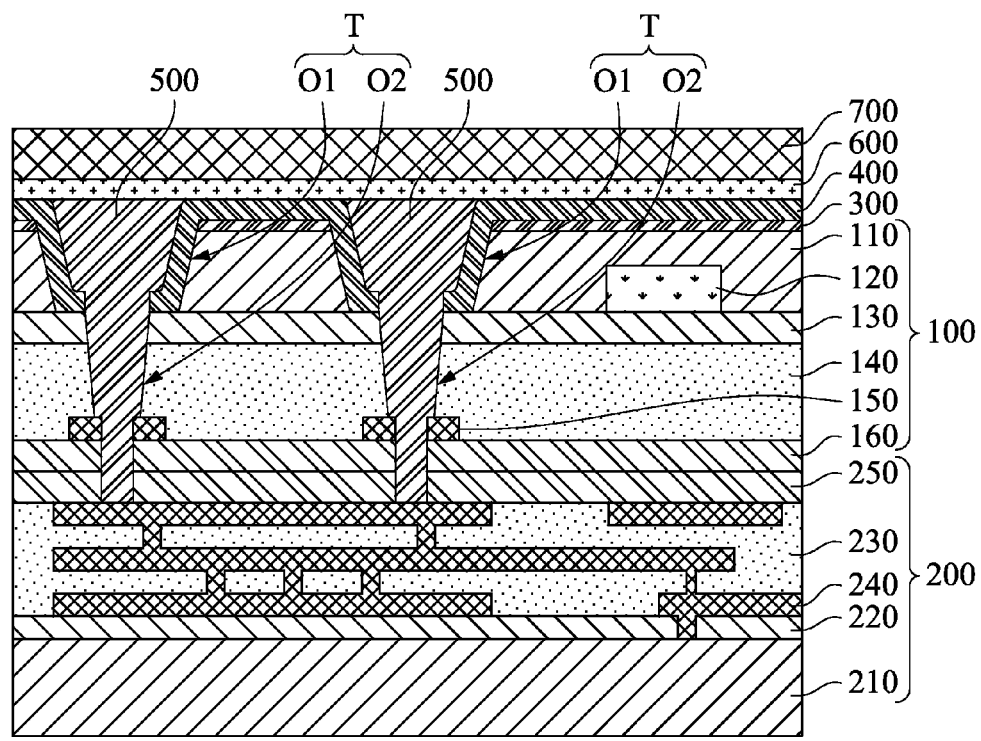

Reference is made to FIG. 9. A second dielectric layer 600 and a metal layer 700 are formed over the conductive plugs 500 and the first dielectric layer 400. The second dielectric layer 600 is made of a dielectric material, such as silicon oxide, silicon nitride, silicon oxynitride, a low-K dielectric, doped glass (e.g. boron silicate glass), or combinations thereof. In some embodiments, the second dielectric layer 600 is formed by, for example, chemical vapor deposition (CVD). The metal layer 700 is made of, for example, copper, aluminum, tungsten, titanium, or alloys or combinations thereof. In some embodiments, the metal layer 700 is formed by, for example, chemical vapor deposition (CVD), plasma-enhanced CVD (PECVD), physical vapor deposition (PVD), or plasma-enhanced PVD (PEPVD).

Figure 10:
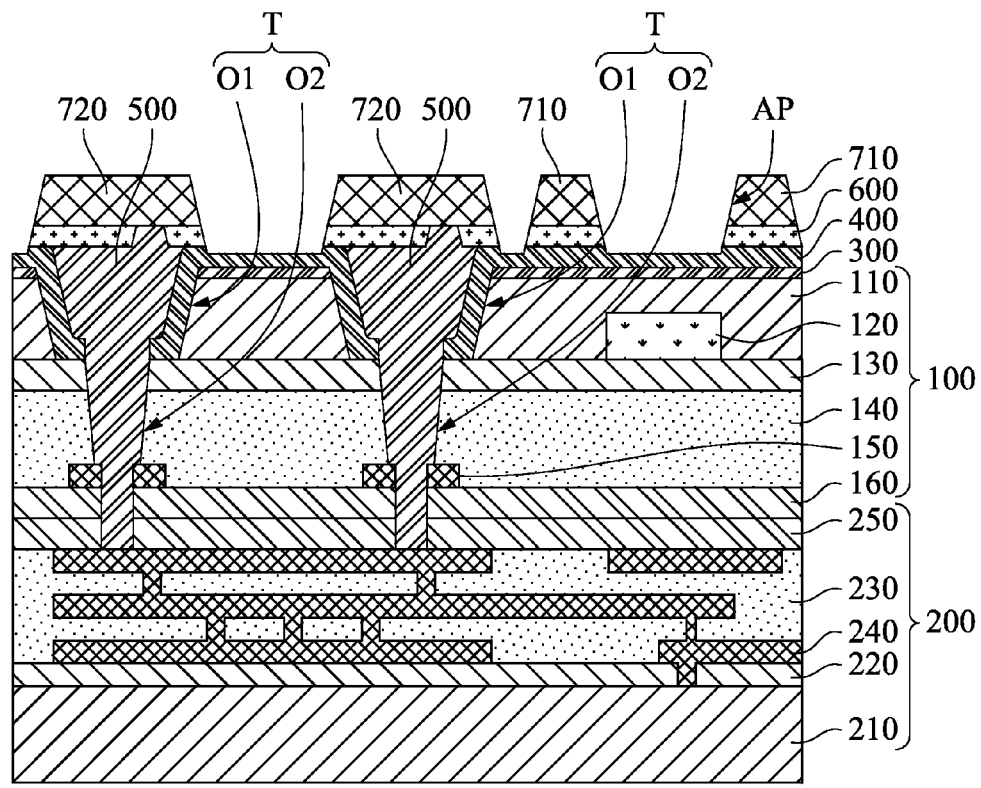

Reference is made to FIG. 10. The metal layer 700 and the second dielectric layer 600 are patterned to form at least one grid 710 on the patterned second dielectric layer 600. The grid 710 defines at least one aperture AP therein. The aperture AP is at least partially aligned with the photodetector 120, such that the incoming light is directed through the aperture AP to the photodetector 120. That is, a vertical projection of the aperture AP on the second substrate 210 overlaps with a vertical projection of the photodetector 120 on the second substrate 210. In some embodiments, a plurality of the apertures AP are respectively aligned with a plurality of the photodetectors 120 to reduce crosstalk between adjacent photodetectors 120.

As shown in FIG. 10, the patterning of the metal layer 700 further forms a plurality of conductive caps 720 respectively over the conductive plugs 500 to prevent the underlying conductive plugs 500 from etching damage. The patterned second dielectric layer 600 is disposed between the conductive caps 720 and the conductive plugs 500 to electrically isolate the conductive caps 720 from the conductive plugs 500. However, in some embodiments, the patterned second dielectric layer 600 may be broken by the deformations of the conductive plugs 500. When the patterned second dielectric layer 600 is broken, the conductive plugs 500 may be respectively electrically connected to the conductive caps 720 through the broken second dielectric layer 600. In such embodiments, if the conductive caps 720 were electrically connected to each other, an abnormal electrical connection between the conductive plugs 500 might be formed.

As shown in FIG. 10, the conductive caps 720 are spatially separated from each other, and thus the conductive caps 720 are electrically isolated from each other. Since the conductive caps 720 are electrically isolated from each other, the abnormal electrical connection between the conductive plugs 500 will not be formed even if the conductive plugs 500 are respectively electrically connected to the conductive caps 720 through the broken second dielectric layer 600.

Figure 14:
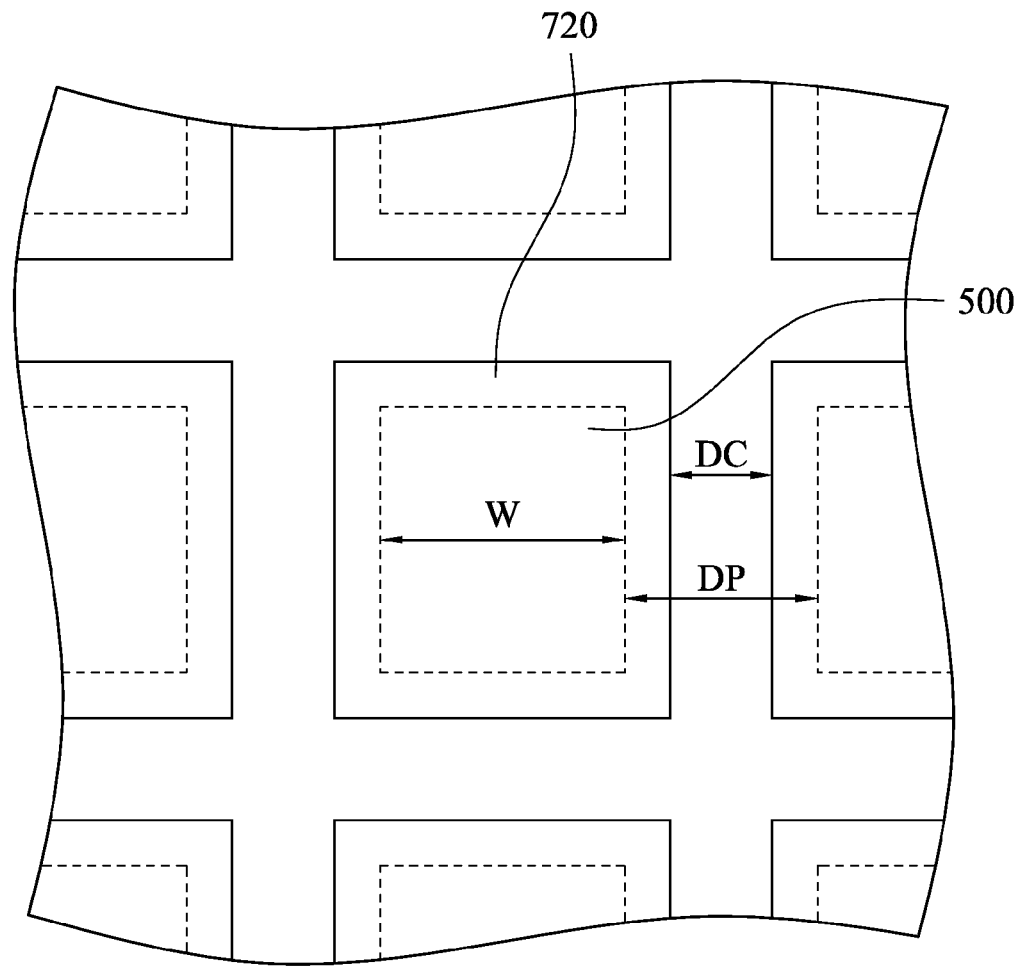
FIG. 14 is a top view of conductive caps and conductive plugs of the semiconductor device in accordance with some embodiments of the present disclosure.

FIG. 14 is a top view of the conductive caps 720 and the conductive plugs 500 in accordance with some embodiments of the present disclosure. As shown in FIG. 14, at least one of the conductive plugs 500 has a width W. The conductive plugs 500 are separated from each other by a distance DP. A designed ratio of the distance DP to the width W (DP/W) is in a range from about 0.1 to about 1. The conductive caps 720 are separated from each other by a distance DC. A designed ratio of the distance DC to the distance DP (DC/DP) is in a range from about 0.1 to about 1.

The terms "about" may be applied to modify any quantitative representation which could permissibly vary without resulting in a change in the basic function to which it is related. For example, the designed ratio of the distance DP to the width W (DP/W) as disclosed therein being in a range from about 0.1 to about 1 may permissibly be somewhat less than 0.1 if the formed conductive plugs 500 are still spatially separated from each other. Similarly, the designed ratio of the distance DC to the distance DP (DC/DP) as disclosed therein being in a range from about 0.1 to about 1 may permissibly be somewhat less than 0.1 if the formed conductive caps 720 are still spatially separated from each other.

Since the grid 710 and the conductive caps 720 are both patterned from the metal layer 700, the grid 710 and the conductive caps 720 are made of substantially the same material (or substantially the same metal to be specific). Furthermore, in some embodiments, the grid 710 and the conductive caps 720 have substantially the same thickness as well.

Figure 11:
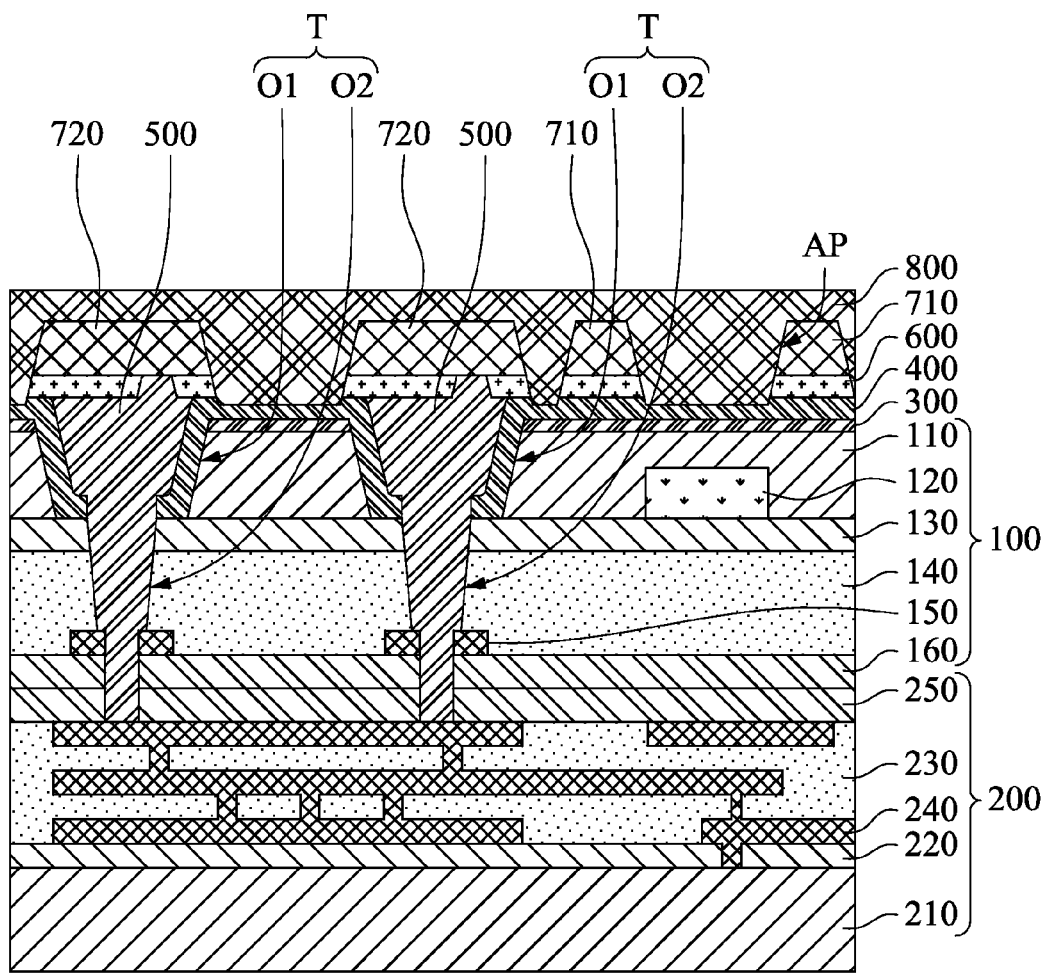

Reference is made to FIG. 11. A passivation layer 800 is filled into the aperture AP of the grid 710. The top surface of the passivation layer 800 is substantially leveled. In some embodiments, the passivation layer 800 overfills the aperture AP of the grid 710. That is, the top surface of the passivation layer 800 is higher than the top surface of the grid 710. The passivation layer 800 is made of a dielectric material, such as silicon oxide, silicon nitride, silicon oxynitride, a low-K dielectric, doped glass (e.g. boron silicate glass), or combinations thereof. In some embodiments, the passivation layer 800 is formed by, for example, chemical vapor deposition (CVD).

Figure 12:
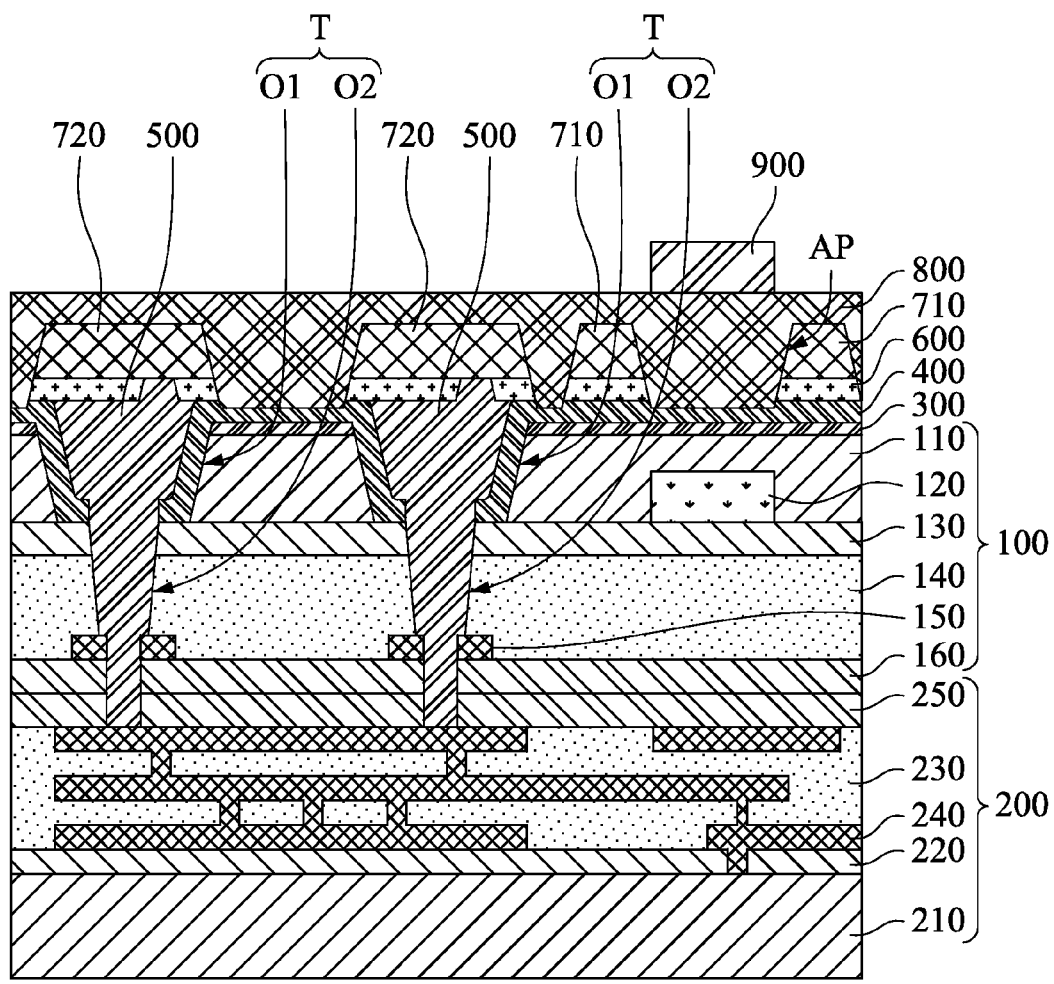

Reference is made to FIG. 12. At least one color filter 900 is formed on the passivation layer 800. The color filter 900 is at least partially aligned with the photodetector 120, such that the incoming light is directed through the color filter 900 to the photodetector 120. That is, a vertical projection of the color filter 900 on the second substrate 210 overlaps with a vertical projection of the photodetector 120 on the second substrate 210. In some embodiments, a plurality of the color filters 900 are respectively aligned with a plurality of the photodetectors 120. The color filters 900 are made of a dye-based (or pigment based) polymer or resin for filtering a specific wavelength band of the incoming light, which corresponds to a colorspectrum (e.g. red, green, blue, yellow, cyan, or magenta). For example, a green color filter passes green light (e.g. light with a wavelength in a range from about 495 nm to about 570 nm) and reflects and/or absorbs light out of that range (e.g. red light or blue light).

Figure 13:
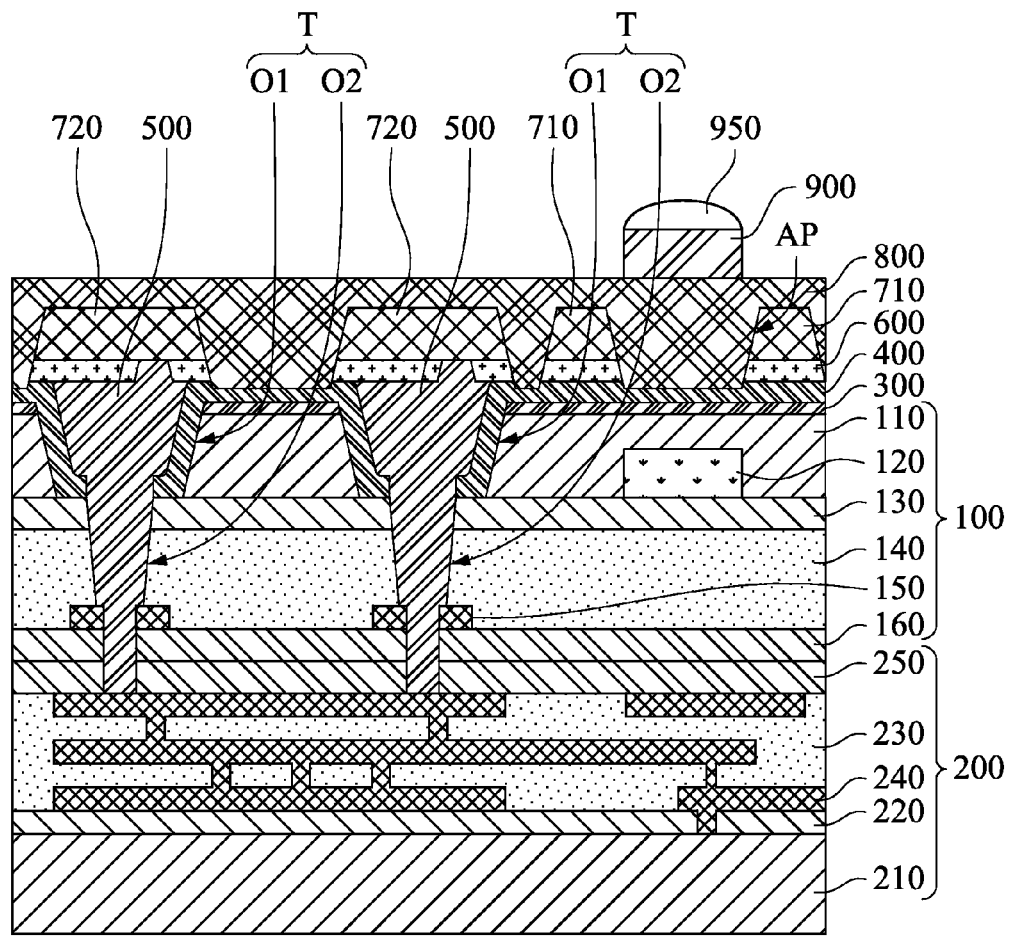

Reference is made to FIG. 13. At least one micro-lens 950 is formed over the color filter 900 for directing and focusing the incoming light toward the photodetector 120. The micro-lens 950 is at least partially aligned with the photodetector 120. That is, a vertical projection of the micro-lens 950 on the second substrate 210 overlaps with a vertical projection of the photodetector 120 on the second substrate 210. In some embodiments, a plurality of the micro-lenses 950 are respectively aligned with a plurality of the photodetectors 120. The micro-lens 950 is formed by patterning a polymer layer formed over the color filter 900. A reflow process is then performed on the patterned polymer layer, thereby creating the curve shape of the micro-lens 950.

In order to prevent short circuit when the second dielectric layer 600 is broken, the conductive caps 720 are designed to be electrically isolated from each other. Since the conductive caps 720 are electrically isolated from each other, an abnormal electrical connection between the conductive plugs 500 will not be formed even if the conductive plugs 500 are respectively electrically connected to the conductive caps 720 through the broken second dielectric layer 600. Furthermore, the process window for the subsequent process steps followed by the formation of the second dielectric layer 600 can be enlarged since whether the second dielectric layer 600 is broken is not a concern.

According to some embodiments of the present disclosure, a semiconductor device includes a first substrate, a second substrate, a plurality of through vias (TVs), and a plurality of conductive caps. The first substrate has at least one electrical component disposed thereon. The second substrate is stacked on the first substrate. The TVs extend through the second substrate to be electrically connected to the at least one electrical component of the first substrate. The conductive caps respectively cover the TVs, and the conductive caps are electrically isolated from each other.

According to some embodiments of the present disclosure, a semiconductor device includes a first substrate, a second substrate, a first through via (TV), a second TV, a first conductive cap, and a second conductive cap. The first substrate has at least one electrical component disposed thereon. The second substrate is stacked on the first substrate. The first TV extends through the second substrate to be electrically connected to the at least one electrical component of the first substrate. The second TV extends through the second substrate to be electrically connected to the at least one electrical component of the first substrate. The first conductive cap covers the first TV. The second conductive cap covers the second TV. The first conductive cap and the second conductive cap are spatially separated from each other.

According to some embodiments of the present disclosure, a method for manufacturing a semiconductor device includes the following steps. A first substrate is stacked on a second substrate. The second substrate has at least one electrical component disposed thereon. A plurality of through vias (TVs) are formed. The TVs extend through the first substrate to be electrically connected to the at least one electrical component of the second substrate. A plurality of conductive caps are formed. The conductive caps respectively cover the TVs, and the conductive caps are separated from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first semiconductor substrate having at least one electrical component disposed thereon;
   a second semiconductor substrate stacked on the first semiconductor substrate;
   at least one photodetector formed in the second semiconductor substrate;
   a plurality of through vias (TVs) extending through the second semiconductor substrate to be electrically connected to the at least one electrical component of the first semiconductor substrate;
   a plurality of conductive caps respectively covering the TVs, wherein the conductive caps are electrically isolated from each other; and at least one grid formed on the second semiconductor substrate and defining at least one aperture therein, wherein the grid and the conductive caps have substantially the same thickness.

2. The semiconductor device of claim 1, further comprising:
a dielectric layer disposed between the conductive caps and the TVs.

3. The semiconductor device of claim 1, wherein at least one of the TVs is electrically connected to at least one of the conductive caps.

4. The semiconductor device of claim 1, wherein the aperture is at least partially aligned with the photodetector.

5. The semiconductor device of claim 1, wherein the grid and the conductive caps are made of substantially the same material.

6. The semiconductor device of claim 1, wherein at least one of the TVs comprises:
a through hole extending through the second semiconductor substrate;
a conductive plug disposed in the through hole and electrically connected to the at least one electrical component of the first semiconductor substrate; and
a dielectric layer disposed between the second semiconductor substrate and the conductive plug.

7. The semiconductor device of claim 1, further comprising:
at least one dielectric layer at least partially sandwiched between the conductive caps and the TVs.

8. A semiconductor device, comprising:
a first semiconductor substrate having at least one electrical component disposed thereon;
a second semiconductor substrate stacked on the first semiconductor substrate;
a first through via (TV) extending through the second semiconductor substrate to be electrically connected to the at least one electrical component of the first semiconductor substrate, the first TV having a top surface;
a second TV extending through the second semiconductor substrate to be electrically connected to the at least one electrical component of the first semiconductor substrate;
a first conductive cap covering the first TV, the first conductive cap having a bottom surface facing the top surface of the first TV;
a first dielectric layer disposed at least between the top surface of the first TV and the bottom surface of the first conductive cap; and
a second conductive cap covering the second TV, wherein the first conductive cap and the second conductive cap are spatially separated from each other.

9. The semiconductor device of claim 8, further comprising:
a second dielectric layer disposed at least between the second TV and the second conductive cap.

10. The semiconductor device of claim 9, wherein the first dielectric layer is spatially separated from the second dielectric layer.

11. The semiconductor device of claim 8, wherein the first TV is electrically connected to the first conductive cap.

12. The semiconductor device of claim 11, wherein the second TV is electrically connected to the second conductive cap.

13. The semiconductor device of claim 8, further comprising:
at least one photodetector formed in the second semiconductor substrate; and
at least one grid formed on the second semiconductor substrate and defining at least one aperture therein, wherein a vertical projection of the aperture on the first semiconductor substrate overlaps with a vertical projection of the photodetector on the first semiconductor substrate.

14. The semiconductor device of claim 13, wherein the grid and the first conductive cap are made of substantially the same metal.

15. The semiconductor device of claim 14, wherein the grid and the second conductive cap are made of substantially the same metal.

16. The semiconductor device of claim 8, wherein the first TV is a first through-oxide via (TOV).

17. The semiconductor device of claim 16, wherein the second TV is a second TOV.

18. A method for manufacturing a semiconductor device, the method comprising:
forming at least one photodetector in a first substrate;
stacking the first substrate on a second substrate having at least one electrical component disposed thereon;
forming a plurality of through vias (TVs) extending through the first substrate to be electrically connected to the at least one electrical component of the second substrate;
forming a conductive layer on the first substrate; and
patterning the conductive layer to form a plurality of conductive caps respectively covering the TVs and at least one grid on the first substrate, wherein the conductive caps are separated from each other, the grid defines at least one aperture therein, and the aperture is at least partially aligned with the photodetector.

19. The method of claim 18, further comprising:
forming at least one dielectric layer at least on the TVs before forming the conductive layer.

20. The method of claim 19, wherein patterning the conductive layer further patterns the dielectric layer.

* * * * *